(12) United States Patent
Agrawal et al.

(10) Patent No.: US 12,026,202 B2
(45) Date of Patent: Jul. 2, 2024

(54) MEMORY OPTIMIZATION FOR STORING OBJECTS IN NESTED HASH MAPS USED IN ELECTRONIC DESIGN AUTOMATION SYSTEMS

(71) Applicant: Synopsys, Inc., Mountain View, CA (US)

(72) Inventors: Brijesh Agrawal, Greater Noida (IN); Abhishek Verma, New Delhi (IN); Deepak Ahuja, New Delhi (IN); Paras Mal Jain, Cupertino, CA (US)

(73) Assignee: Synopsys, Inc., Sunnyvale, CA (US)

( * ) Notice: Subject to any disclaimer, the term of this patent is extended or adjusted under 35 U.S.C. 154(b) by 29 days.

(21) Appl. No.: 17/894,557

(22) Filed: Aug. 24, 2022

(65) Prior Publication Data

US 2023/0065867 A1 Mar. 2, 2023

(30) Foreign Application Priority Data

Aug. 27, 2021 (IN) .............................. 202141038921

(51) Int. Cl.
*G06F 16/90* (2019.01)
*G06F 16/901* (2019.01)
*G06F 30/394* (2020.01)

(52) U.S. Cl.
CPC ........ *G06F 16/9014* (2019.01); *G06F 30/394* (2020.01)

(58) Field of Classification Search
CPC ........................... G06F 16/9014; G06F 30/394
See application file for complete search history.

(56) References Cited

U.S. PATENT DOCUMENTS

2021/0185368 A1* 6/2021 Hao ................... H04N 21/8456

* cited by examiner

*Primary Examiner* — Loc Tran
(74) *Attorney, Agent, or Firm* — Park, Vaughan, Fleming & Dowler LLP; Laxman Sahasrabuddhe

(57) ABSTRACT

Sets of objects may be received which are desired to be stored using a nested hash map, where the nested hash map may include multiple levels, and where each set of objects in the sets of objects may correspond to a level in the nested hash map. The nested hash map may be created from a bottom level of the nested hash map to a top level of the nested hash map, which may include: creating a first hash map at a first level of the nested hash map, creating a first shared pointer which points to the first hash map, and creating a second hash map at a second level which is immediately above the first level, where the second hash map maps at least one object to the first shared pointer.

17 Claims, 9 Drawing Sheets

| Entry No. | Option 1 | Option 2 | Option 3 | Constraint Index (backref) |
|---|---|---|---|---|
| 1 | A[1] | B[1] | C[1] | 1 |
| 2 | A[1] | B[1] | C[0] | 1 |
| 3 | A[1] | B[0] | C[1] | 1 |
| 4 | A[1] | B[0] | C[0] | 1 |
| 5 | A[0] | B[1] | C[1] | 1 |
| 6 | A[0] | B[1] | C[0] | 1 |
| 7 | A[0] | B[0] | C[1] | 1 |
| 8 | A[0] | B[0] | C[0] | 1 |

Options 2 & 3 have duplicate entries

| Entry No. | Option 1 | Option 2 | Option 3 | Constraint Index (backref) |
|---|---|---|---|---|
| 1 | A[1] | B[1] | C[1] | 1 |
| 2 | A[1] | B[1] | C[0] | 1 |
| 3 | A[1] | B[0] | C[1] | 1 |
| 4 | A[1] | B[0] | C[0] | 1 |
| 5 | A[0] | B[1] | C[1] | 1 |
| 6 | A[0] | B[1] | C[0] | 1 |
| 7 | A[0] | B[0] | C[1] | 1 |
| 8 | A[0] | B[0] | C[0] | 1 |

Options 2 & 3 have duplicate entries

FIG. 1

| Option 1 | Option 2 | Option 3 | Constraint |
|---|---|---|---|
| A[0] | B[0] | C[0] | 1 |
| A[1] | B[1] | C[1] | 1 |
| | | SP1 | |
| | | SP2 | |

FIG. 2

MEMORY OPTIMIZATION FOR STORING OBJECTS IN NESTED HASH MAPS USED IN ELECTRONIC DESIGN AUTOMATION SYSTEMS

RELATED APPLICATION

This application claims the benefit of Indian Provisional Application Serial No. 202141038921, filed on 27 Aug. 2021, the contents of which are herein incorporated by reference in their entirety for all purposes.

TECHNICAL FIELD

The present disclosure generally relates to electronic design automation (EDA) systems. More specifically, the present disclosure relates to memory optimization for storing objects in nested hash maps used in EDA systems.

BACKGROUND

An increasing demand for computing and storage capacity has fueled an increase in the size and complexity of integrated circuit (IC) designs. EDA systems may be used to create IC designs. The amount of memory used by software applications in EDA systems continues to increase. It is important to reduce and/or optimize the amount of memory used to store objects in EDA systems.

SUMMARY

Embodiments described herein may feature memory optimization for storing objects in nested hash maps, e.g., nested hash maps used in EDA systems. Sets of objects may be received which are desired to be stored using a nested hash map. For example, the sets of objects may specify a set of possible paths in an IC design. The nested hash map may include multiple levels, and each set of objects in the sets of objects may correspond to a level in the nested hash map. The nested hash map may be created from a bottom level of the nested hash map to a top level of the nested hash map, and the process for creating the nested hash map may include: creating a first hash map at a first level of the nested hash map, creating a first shared pointer which points to the first hash map, and creating a second hash map at a second level which is immediately above the first level, where the second hash map maps at least one object to the first shared pointer.

In some embodiments described herein, the first shared pointer may be associated with a first reference count which is equal to a count of hash map entries which map to the first shared pointer.

In some embodiments described herein, the first reference count may be incremented when an additional entry in a hash map maps to the first shared pointer. In some embodiments described herein, the first reference count may be decremented when an entry in a hash map no longer maps to the first shared pointer.

In some embodiments described herein, a copy of the first hash map may be created. The copy of the first hash map may be modified to obtain a modified copy of the first hash map. A second shared pointer may be created which points to the modified copy of the first hash map. A third hash map may be created which is at the second level, and which maps at least one object to the second shared pointer. In these embodiments, the first reference count may be decremented.

BRIEF DESCRIPTION OF THE FIGURES

The disclosure can be understood based on the detailed description given below and the accompanying figures. The figures, examples and embodiments are for illustrative purposes, and do not limit the scope of the disclosure. Furthermore, the figures are not necessarily drawn to scale.

FIG. 1 illustrates a nested hash map.

FIG. 2 illustrates a nested hash map in accordance with some embodiments described herein.

DETAILED DESCRIPTION

Figure 3:
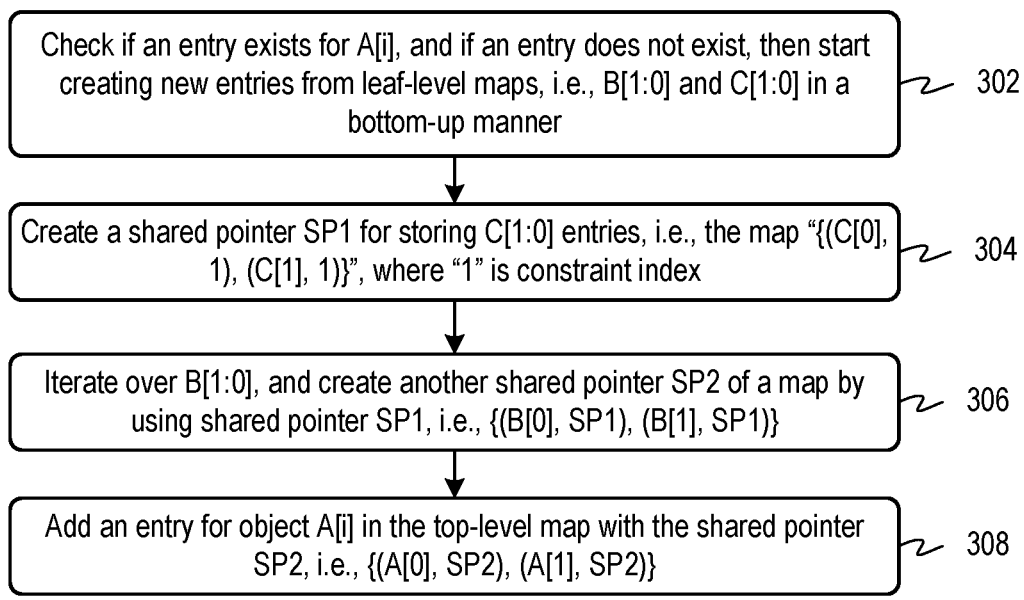
FIGS. 3-4 illustrate a process for creating a nested hash map based on a first constraint in accordance with some embodiments described herein.

Many software applications, including, but not limited to, software applications used in EDA systems may encounter many situations where the application stores multiple objects in relation to each other. For example, software application used in EDA systems may use a nested hash map to store objects.

The term "object" may generally refer to any software entity, which may include, but is not limited to, a value, a variable, a data structure, a class, a map, a reference, or a pointer. An object may be used to represent any desired entity. For example, in an EDA system, an object may be used to represent a part of an IC design, which may include but is not limited to, a terminal, a pin, a logic gate, a register, or a circuit block which may include one or more circuit elements.

A hash map is a data structure that stores a relationship between a first set of objects and a second set of objects. A hash value may be generated based on a first object selected from the first set of objects. The hash value may be used to index into the hash map to identify a second object in the second set of objects. A nested hash map comprises two or more levels of hash maps. A nested hash map allows fast and convenient access and storage of objects. Specifically, for a n-level nested hash map, the worst-case time complexity for retrieving data may have O(n) time complexity.

Nested hash maps may be particularly useful when objects are desired to be queried based on a sequence of criteria or conditions. Specifically, if a query at a given level in the nested hash map is successful (i.e., the hash value is found in the hash map at the given level), then the next query may performed on the next hash map (at the lower level) which organizes a subset of the overall data set.

However, in some situations the size of the nested hash map may increase exponentially with respect to the number of objects in each level of the nested hash map. In such situations, the nested hash map may cause performance issues or cause the system to run out of memory.

Embodiments described herein overcome such memory issues in nested hash maps by implementing a shared memory structure for duplicate objects in nested hash maps. Specifically, the hash map at each level may be stored as a pointer, which may be shared at higher levels in the hash map, and which may result in reducing the memory footprint of the nested hash map.

One problem in nested hash maps is that upper levels of the hash map may store duplicate data. Embodiments described herein may reduce or eliminate duplicate data by using templatized shared pointers. Specifically, instead of storing duplicate data, embodiments described herein may use the same shared pointer, and increase the reference count of the shared pointer by one. A shared pointer does not allocate memory to store the duplicate data. Instead, the same pointer value is used again, which saves memory.

The following case illustrates how embodiments described herein can significantly reduce the amount of memory used for storing a nested hash map. Suppose a constraint "set_cdc_ignore_path" has three options, which are specified on the command line as follows: "set_cdc_ignore_path-from A[1999:0]-to B[1999:0]-through C[1999:0]." This constraint may be represented internally by the EDA application using a nested hash map. Specifically, the 2,000 objects A[1999:0] may be stored at the first level of the nested hash map, the 2,000 objects B[1999:0] may be stored at the second level of the nested hash map, and the 2,000 objects C[1999:0] may be stored at the third level of the nested hash map. The total number of unique combinations in the nested hash map is 2,000×2,000×2,000=8,000,000,000. If we assume that each object or map entry uses 100 bytes of storage, then the total amount of memory used by the nested hash map is 800 GB.

The above example used three levels of nesting. If more levels of nesting are used, then the memory footprint grows exponentially. For example, if the three-level hash map described above is extended to five levels by adding two levels of clock options, where each level of clock option has three clocks, then the total amount of memory used by the nested hash map explodes to 2,000×2,000×2,000×3×3=7.2 TB. It is noted that using a Binary Decision Diagram (BDD) may not solve the above-described memory problem because each object combination may need to be stored as a distinct Boolean expression in the BDD.

Embodiments described herein can store the above-mentioned hash map which used 800 GB by using approximately (2,000+2,000+2,000)×100 bytes=0.6 MB, which is nearly one million times less memory. In addition to the reduction in memory storage, embodiments described herein improve performance of the software application that uses the nested hash map because duplicate data is not created and/or processed by the nested hash map. By not processing duplicate data, embodiments described herein reduce the amount of computational resources (e.g., processor cycles) that are used for performing the function (e.g., processing ignore path constraints) that uses hash maps. The reduction in the amount of computational resources can be significant especially when the hash map storage is reduced significantly (e.g., 8 GB storage is reduced to 0.6 MB storage).

In other words, embodiments described herein reduce the memory footprint and increase performance of software applications that use nested hash maps, especially when the nested hash maps store a large number of objects in each level and/or the nested hash maps have a large number of levels. Some embodiments described herein may use templatized shared pointers to store duplicate data, which may allow the nested hash map to be generally used with any software application.

FIG. 1 illustrates a nested hash map. Nested hash map 100 stores objects for a constraint that includes three options which are labeled in FIG. 1 as Option 1, Option 2, and Option3. Specifically, hash map 100 may be created to store the object combinations specified in the constraint "constr-opt1 A[1:0]-opt2 B[1:0]-opt3 C[1:0]." In this constraint, A[1:0] may refer to the set of objects A[0] and A[1]. Likewise, B[1:0] may refer to the set of objects B[0] and B[1] and C[1:0] may refer to the set of objects C[0] and C[1].

The three options in the constraint may enable the user to specify sets of objects on which a particular operation is to be performed or is not to be performed. For example, a software tool in an EDA system may verify an IC design. The user may use the above-described constraint to specify a set of paths that are to be ignored by the software tool, i.e., the constraint "constr-opt1 A[1:0]-opt2 B[1:0]-opt3 C[1:0]" may be used to specify a set of eight paths that pass through objects A[1:0], B[1:0], and C[1:0], and which are to be ignored during verification of the IC design.

A nested hash map may be used to quickly determine whether a given path is to be ignored by the software application. For example, as shown in FIG. 1, nested hash map 100 stores all eight combinations of the objects along with the index of the user constraint (last column in the nested hash map). The index of the user constraint may be used as a back reference to the constraint that corresponds to the hash map entry.

Nested hash map 100 may include duplicate entries for some sets of option values. For example, entries 1 and 5 in nested hash map 100 have the same combination of level 2 (corresponding to opt2) and level 3 (corresponding to opt3) objects, i.e., the combination "B[1] and C[1]" appears in entries 1 and 5. Likewise, entries 2 and 6, and entries 3 and 7 are also have duplicate level 2 and level 3 objects. Duplicate entries also exist in nested hash map 100 when only the third level objects are considered. For example, the third level objects ("C[1]") in entries 1, 3, 5, and 7 are duplicates.

FIG. 2 illustrates a nested hash map in accordance with some embodiments described herein.

Shared pointer SP1 points to a hash map that maps "C" objects to constraint number values. For example, as shown in FIG. 2, SP1 points to a hash map with two entries—a first entry that maps C[0] to the value 1, and a second entry that maps C[1] to the value 1. Shared pointer SP2 points to a hash map that maps a "B" object to shared pointer SP1. The top-level hash map maps "A" objects to shared pointer SP2. The memory required to store the nested hash map in FIG. 2 is significantly smaller than the memory required to store the hash map shown in FIG. 1 because the hash map shown in FIG. 1 has duplicate entries, whereas the hash map shown in FIG. 2 does not.

Figure 4:
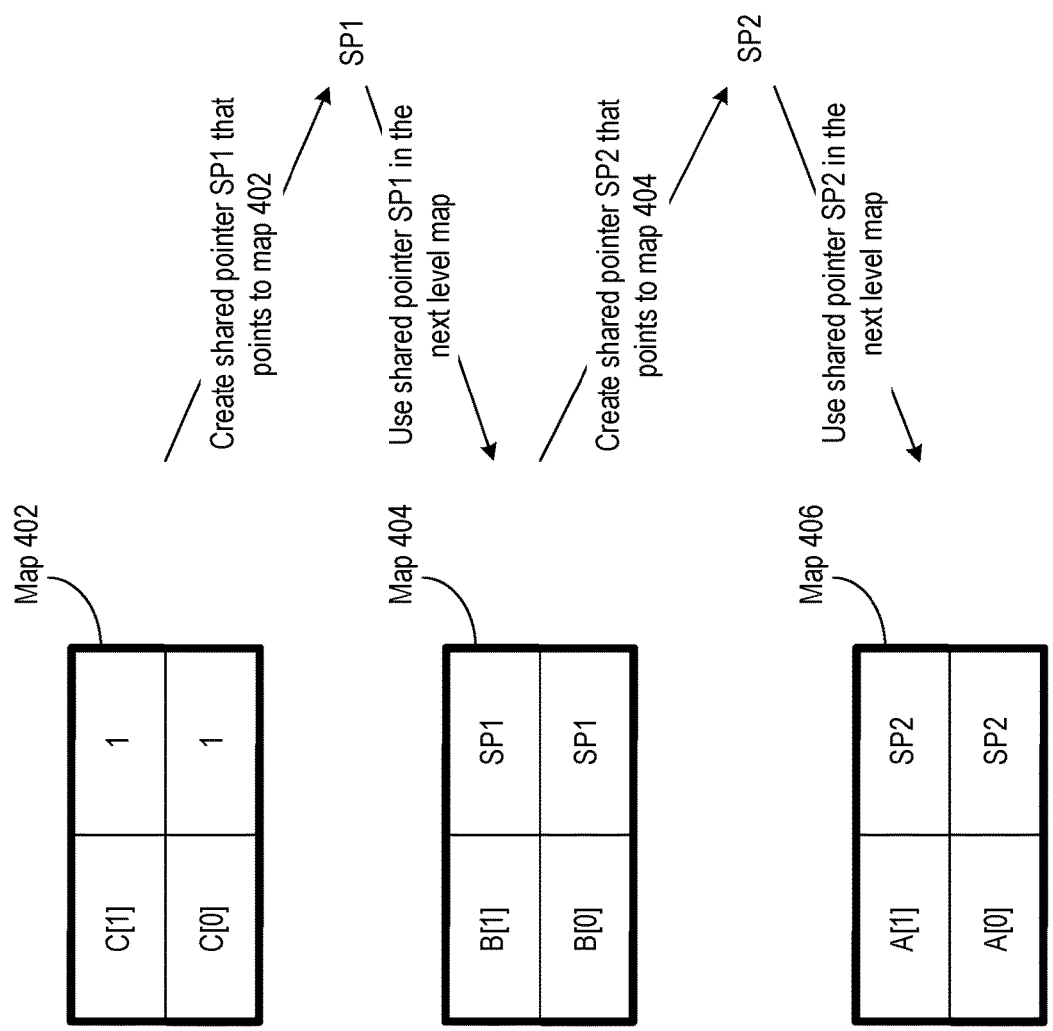

FIGS. 3-4 illustrate a process for creating a nested hash map based on a first constraint in accordance with some embodiments described herein.

Consider the first constraint "constr-opt1 A[1:0]-opt2 B[1:0]-opt3 C[1:0]." As shown in FIGS. 3-4, a nested hash map may be created based on the first constraint by performing the following operations for each A[i], where 0<i<1. An embodiment may check if an entry exists for A[i], and if an entry does not exist, then the embodiment may start creating new entries from leaf-level maps, i.e., B[1:0] and C[1:0] in a bottom-up manner (at 302).

A shared pointer SP1 may be created for storing C[1:0] entries, i.e., the shared pointer SP1 may correspond to map {(C[0], 1), (C[1], 1)}, where "1" is constraint index (at 304). For example, map 402 in FIG. 4 may be created.

The objects B [1:0] may be iterated over, and another shared pointer SP2 may be created of a map by using shared pointer SP1, i.e., "{(B[0], SP1), (B[1], SP1)}" (at 306). For example, map 404 in FIG. 4 may be created which maps objects B[0] and B[1] to shared pointer SP1.

An entry for object A[i] may be added in the top-level map with the shared pointer SP2 for each object, i.e., {(A[0], SP2), (A[1], SP2)} (at 308). For example, map 406 in FIG. 4 may be created which maps objects A[0] and A[1] to shared pointer SP2.

Advantages of the process illustrated in FIGS. 3-4 include, but are not limited to, (1) significantly less computation is required for processing object A[1] because it has the same data as object A[0], (2) significantly less computation is required for processing object B[1] because it has the same data as object B[0], and (3) the memory required to store the nested hash map is significantly less than the memory required in FIG. 1.

Figure 5:
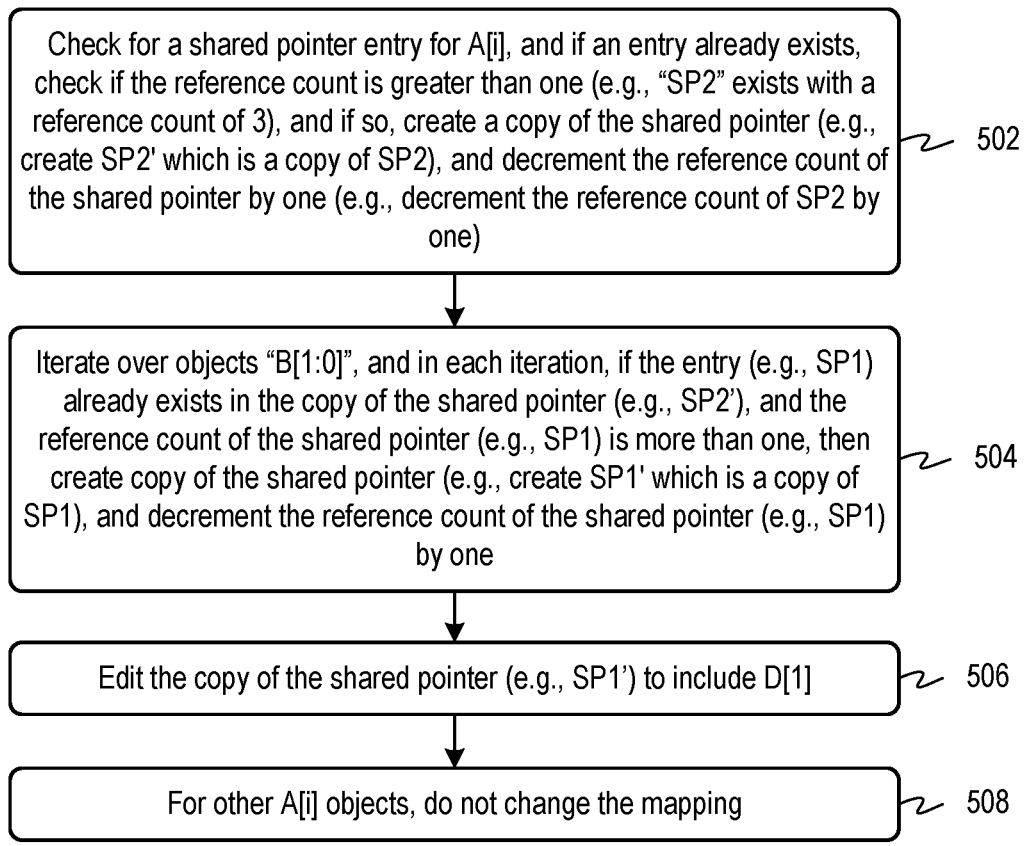
FIGS. 5-6 illustrate a process for updating the nested hash map based on a second constraint in accordance with some embodiments described herein.
Figure 6:
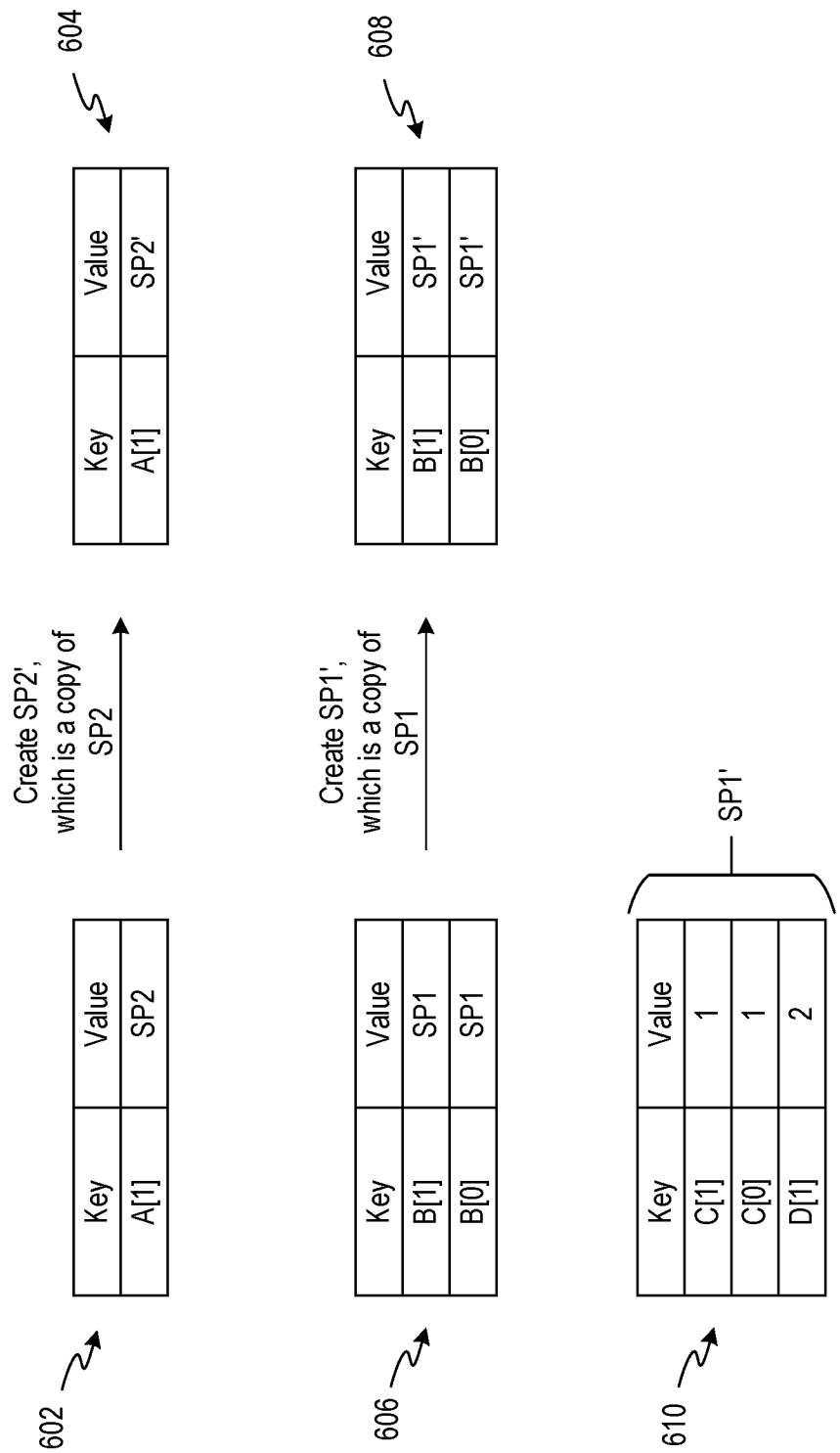

FIGS. 5-6 illustrate a process for updating the nested hash map based on a second constraint in accordance with some embodiments described herein.

Suppose a second constraint "set_cdc_ignore_path-opt1 A[1]-opt2 B[1:0]-opt3 D[1]" is received after the first constraint. As shown in FIGS. 5-6, the nested hash map may be updated based on the second constraint as follows.

A shared pointer entry for A[1] may be checked, and if an entry already exists, then it may be checked if the reference count is greater than one (e.g., "SP2" exists in map entry 602 in FIG. 6 with a reference count of 3), and if so, a shallow copy of the shared pointer may be created (e.g., create SP2' which is a copy of SP2), and the reference count of the shared pointer may be decremented by 1, e.g., the reference count of SP2 may be decremented by one (at 502 in FIG. 5). For example, map entry 604 may be obtained. The term "shallow copy" may refer to creating a copy of the pointer without copying the memory content that the pointer points to.

Objects "B[1:0]" may be iterated over, and in each iteration, if the entry (e.g., SP1) already exists in the copy of the shared pointer (e.g., SP2'), and the reference count of the shared pointer (e.g., SP1) is more than 1, then a copy of the shared pointer may be created (e.g., SP1' may be created which is a copy of SP1), and the reference count of the shared pointer may be decremented (e.g., SP1) by one (at 504 in FIG. 5). For example, in FIG. 6, SP2 may point to map 606 and SP2' may point to map 608.

The copy of the shared pointer (e.g., SP1') may be edited to include D[1] (at 506 in FIG. 5). The reference count of SP1' is now 3. For example, map 610 may be obtained which includes object D[1]. For other A[i] objects, the mapping is not changed (at 508).

As shown in FIGS. 5-6, the shared pointer may be edited if is used by only 1 object. Otherwise, a new copy may be created on demand (i.e., as needed). In other words, embodiments described herein edit the map referenced by a shared pointer if the reference count is 1. However, if the reference count is greater than 1 (i.e., multiple objects reference the map pointed to by the shared pointer), then the embodiments may create a copy and edit the copy. In this manner, embodiments described herein use shared pointers to reuse maps whenever possible and increase the map memory footprint when reuse is not possible. Further, the same shared pointer SP1' that refers to B[0] may also be used for B[1] because B[0] and B[1] had the same SP1.

Figure 7:
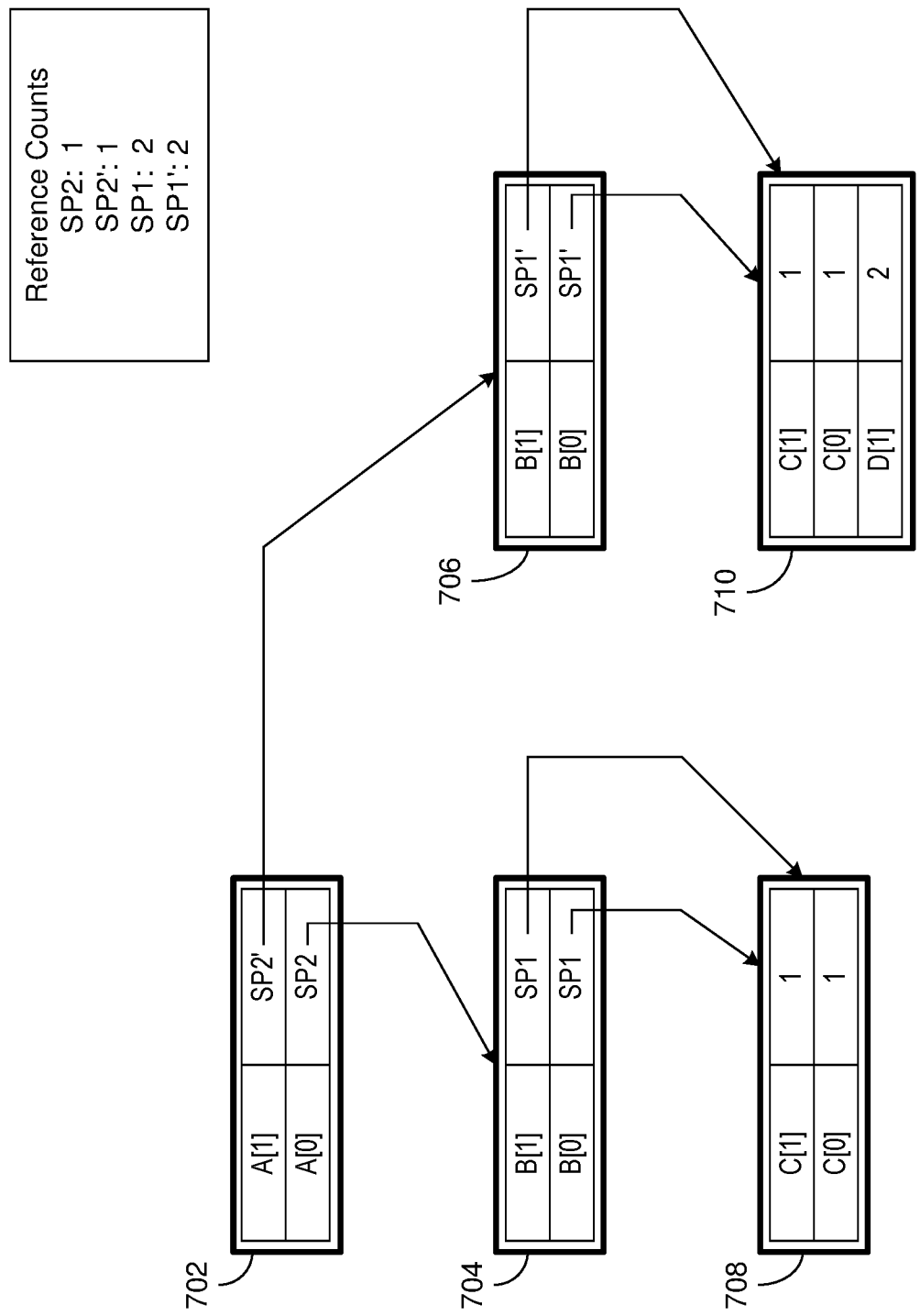
FIG. 7 illustrates the nested hash map after processing the first and the second constraint in accordance with some embodiments described herein.

FIG. 7 illustrates the nested hash map after processing the first and the second constraint in accordance with some embodiments described herein.

Top-level map 702 maps objects A[0] and A[1] to shared pointers SP2 and SP2', respectively. Shared pointers SP2 and SP2' point to maps 704 and 706, respectively. Map 704 maps objects B[0] and B[1] to shared pointers SP1. Map 706 maps objects B[0] and B[1] to shared pointer SP1'. Shared pointer SP1 points to map 708, which maps objects C[0] and C[1] to constraint index 1. Shared pointer SP1' points to map 710, which maps objects C[0] and C[1] to constraint index 1, and maps object D[1] to constraint index 2.

Figure 8:
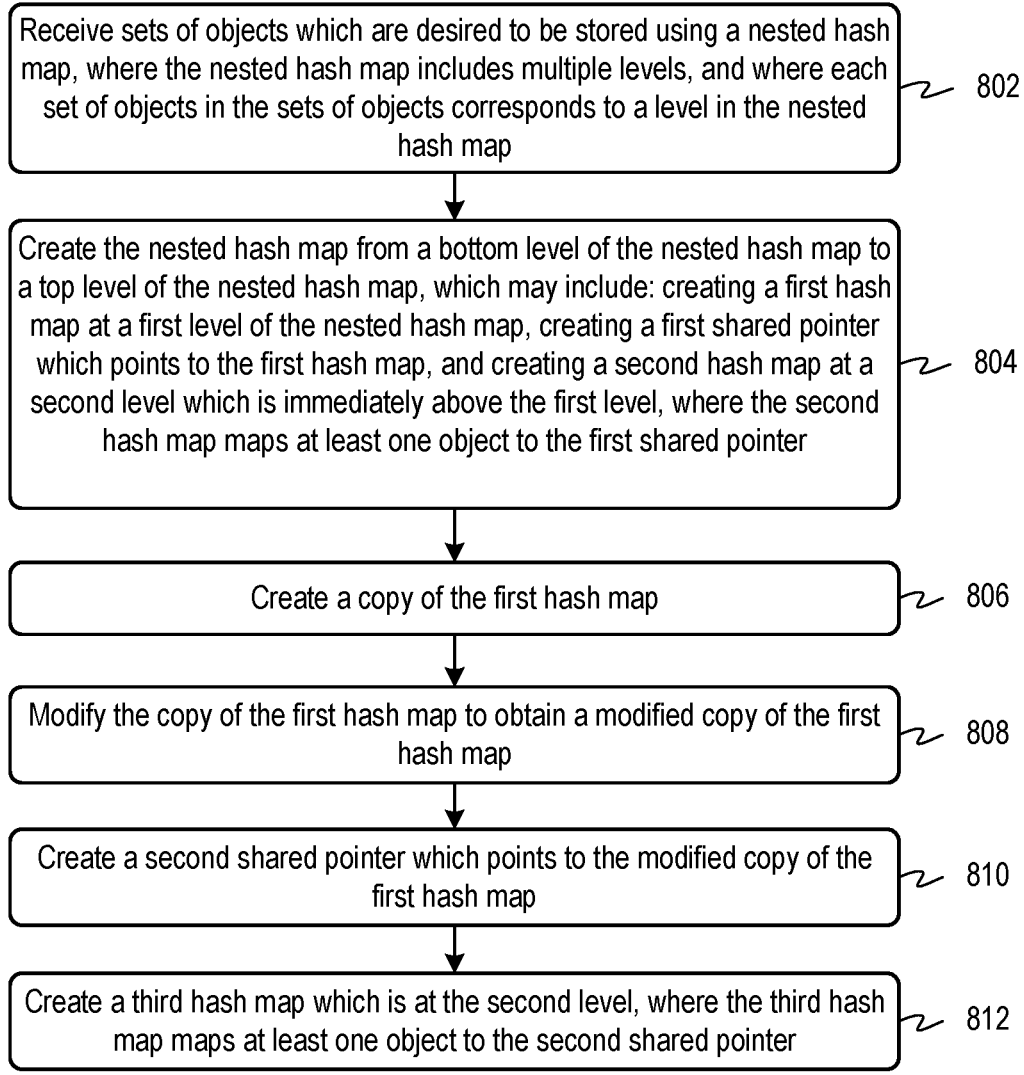
FIG. 8 illustrates a process for creating and updating a nested hash map in accordance with some embodiments described herein.

FIG. 8 illustrates a process for creating and updating a nested hash map in accordance with some embodiments described herein.

Sets of objects may be received which are desired to be stored using a nested hash map, where the nested hash map may include multiple levels, and where each set of objects in the sets of objects may correspond to a level in the nested hash map (at 802).

For example, constraint "constr-opt1 A[1:0]-opt2 B[1:0]-opt3 C[1:0]" may be received. In this constraint, A[1:0] may refer to the set of objects A[0] and A[1]. Likewise, B[1:0] may refer to the set of objects B[0] and B[1] and C[1:0] may refer to the set of objects C[0] and C[1]. A nested hash map may generally have two or more levels. In the above constraint, objects A[1:0] may correspond to the top level of the nested hash map, objects B[1:0] may correspond to the middle level of the nested hash map, and objects C[1:0] may correspond to the bottom level of the nested hash map. In some embodiments described herein, the sets of objects may specify a set of possible paths in an IC design. For example, the options in the above constraint may specify a set of eight possible paths that passes through A[1:0], B[1:0], and C[1:0].

The nested hash map may be created from a bottom level of the nested hash map to a top level of the nested hash map, which may include: creating a first hash map at a first level of the nested hash map, creating a first shared pointer which points to the first hash map, and creating a second hash map at a second level which is immediately above the first level, where the second hash map maps at least one object to the first shared pointer (at 804).

For example, in FIG. 7, hash map 708 may be created (i.e., create a first hash map at a first level), shared pointer SP1 may be created which points to hash map 708 (i.e., create a first shared pointer which points to the first hash map), and hash map 704 may be created in which object B[0] maps to shared pointer SP1 (i.e., create a second hash map at a second level which is immediately above the first level, where the second hash map maps at least one object to the first shared pointer).

A shared pointer may be associated with a reference count which is equal to a count of hash map entries which map to the shared pointer. For example, in FIG. 7, the reference counts for shared pointers SP2, SP2', SP1, and SP1' are 1, 1, 2, and 2, respectively. A reference count may be incremented when an additional entry in a hash map maps to the first shared pointer. A reference count may be decremented when an entry in a hash map no longer maps to the first shared pointer.

The nested hash map may be updated when processing additional sets of objects. Specifically, a copy of the first hash map may be created (at 806). The copy of the first hash map may be modified to obtain a modified copy of the first hash map (at 808). A second shared pointer may be created which points to the modified copy of the first hash map (at 810). A third hash map may be created which is at the second level, where the third hash map maps at least one object to the second shared pointer (at 812).

For example, in FIG. 7, a copy of map 708 (e.g., the first hash map) may be created and modified to obtain map 710 (e.g., modified copy of the first hash map). Next, shared pointer SP1' may be created which points to map 710 (e.g., a second shared pointer may be created which points to the modified copy of the first hash map). Hash map 706 may be created which maps object B[1] to shared pointer SP1' (e.g., a third hash map may be created which is at the second level, where the third hash map maps at least one object to the second shared pointer).

A storage subsystem of a computer system (such as computer system 900 in FIG. 9) may be used to store the programs and data structures that are used by embodiments described herein.

Figure 9:
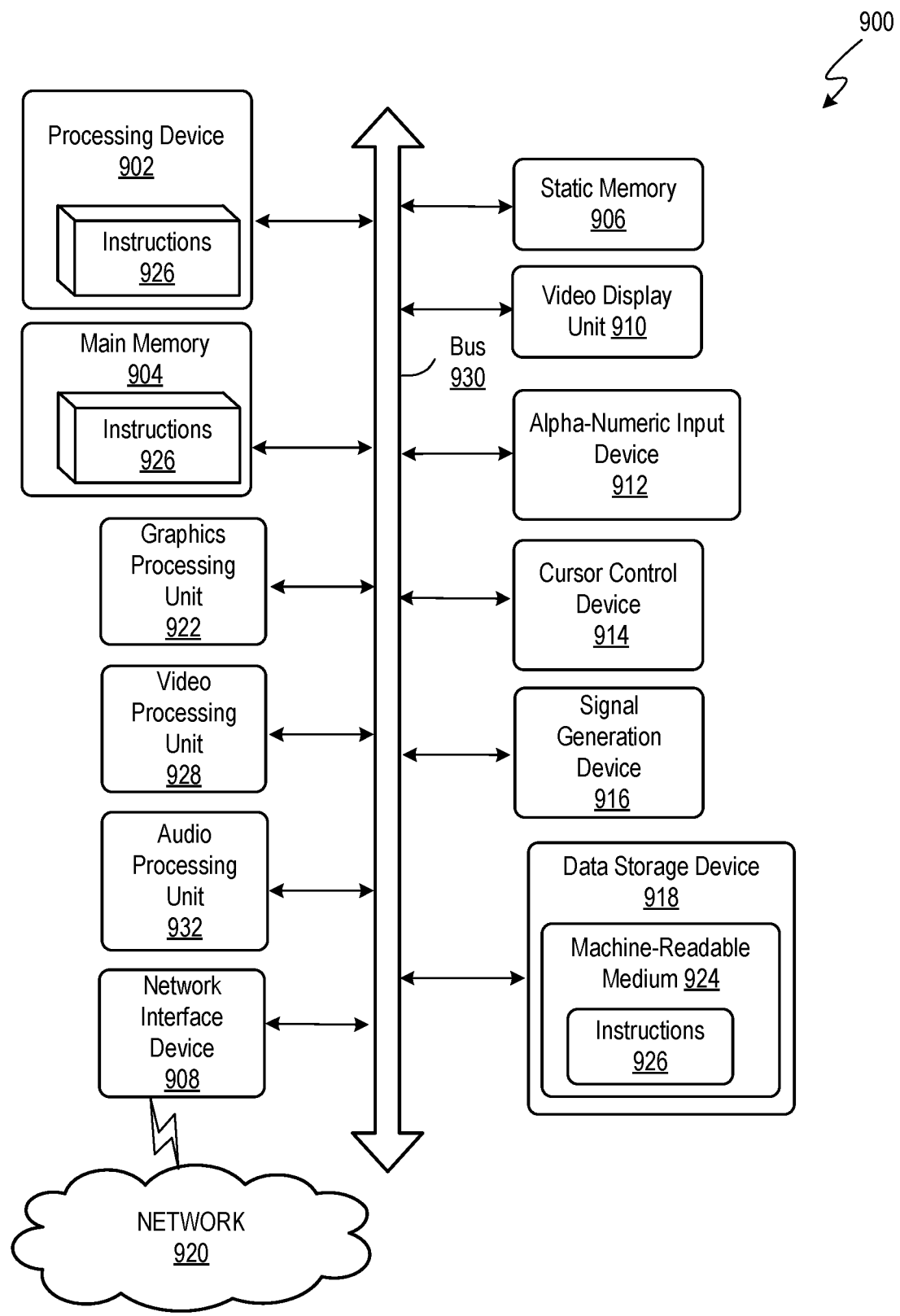
FIG. 9 illustrates an example machine of a computer system within which a set of instructions, for causing the machine to perform any one or more of the methodologies discussed herein, may be executed.

FIG. 9 illustrates an example machine of a computer system within which a set of instructions, for causing the machine to perform any one or more of the methodologies discussed herein, may be executed.

In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various design modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method, comprising:
   receiving sets of objects which are desired to be stored using a nested hash map, wherein the nested hash map includes multiple levels, and wherein each set of objects in the sets of objects corresponds to a level in the nested hash map; and
   creating, by a processor, the nested hash map from a bottom level of the nested hash map to a top level of the nested hash map, wherein the creating comprises:
      creating a first hash map at a first level of the nested hash map,
      creating a first shared pointer which points to the first hash map, and
      creating a second hash map at a second level which is immediately above the first level, wherein the second hash map maps at least one object to the first shared pointer, and wherein the first shared pointer is associated with a first reference count which is equal to a count of hash map entries which map to the first shared pointer.

2. The method of claim 1, further comprising incrementing the first reference count when an additional entry in a hash map maps to the first shared pointer.

3. The method of claim 1, further comprising decrementing the first reference count when an entry in a hash map no longer maps to the first shared pointer.

4. The method of claim 1, further comprising:
   creating a copy of the first hash map;
   modifying the copy of the first hash map to obtain a modified copy of the first hash map;
   creating a second shared pointer which points to the modified copy of the first hash map; and
   creating a third hash map which is at the second level, wherein the third hash map maps at least one object to the second shared pointer.

5. The method of claim 4, further comprising decrementing the first reference count.

6. The method of claim 1, wherein the sets of objects specify a set of paths in an integrated circuit (IC) design.

7. A non-transitory computer-readable medium comprising stored instructions, which when executed by a processor, cause the processor to:
   receive sets of objects which are desired to be stored using a nested hash map, wherein the nested hash map includes multiple levels, wherein each set of objects in the sets of objects corresponds to a level in the nested hash map, and wherein the sets of objects specify a set of paths in an integrated circuit (IC) design; and
   create the nested hash map from a bottom level of the nested hash map to a top level of the nested hash map, wherein the creating comprises:
      creating a first hash map at a first level of the nested hash map,
      creating a first shared pointer which points to the first hash map, and
      creating a second hash map at a second level which is immediately above the first level, wherein the second hash map maps at least one object to the first shared pointer, and wherein the first shared pointer is associated with a first reference count which is equal to a count of hash map entries which map to the first shared pointer.

8. The non-transitory computer-readable medium of claim 7, wherein the stored instructions, which when executed by the processor, cause the processor to increment the first reference count when an additional entry in a hash map maps to the first shared pointer.

9. The non-transitory computer-readable medium of claim 7, wherein the stored instructions, which when executed by the processor, cause the processor to decrement the first reference count when an entry in a hash map no longer maps to the first shared pointer.

10. The non-transitory computer-readable medium of claim 7, wherein the stored instructions, which when executed by the processor, cause the processor to:
    create a copy of the first hash map;
    modify the copy of the first hash map to obtain a modified copy of the first hash map;
    create a second shared pointer which points to the modified copy of the first hash map; and
    create a third hash map which is at the second level, wherein the third hash map maps at least one object to the second shared pointer.

11. The non-transitory computer-readable medium of claim 10, wherein the stored instructions, which when executed by the processor, cause the processor to decrement the first reference count.

12. An apparatus, comprising:
    a memory storing instructions; and a processor, coupled with the memory and to execute the instructions, the instructions when executed causing the processor to:

receive sets of objects which are desired to be stored using a nested hash map, wherein the nested hash map includes multiple levels, wherein each set of objects in the sets of objects corresponds to a level in the nested hash map; and create the nested hash map from a bottom level of the nested hash map to a top level of the nested hash map, wherein the creating comprises:

creating a first hash map at a first level of the nested hash map, creating a first shared pointer which points to the first hash map, and creating a second hash map at a second level which is immediately above the first level, wherein the second hash map maps at least one object to the first shared pointer, and wherein the first shared pointer is associated with a first reference count which is equal to a count of hash map entries which map to the first shared pointer.

13. The apparatus of claim 12, wherein the stored instructions, which when executed by the processor, cause the processor to increment the first reference count when an additional entry in a hash map maps to the first shared pointer.

14. The apparatus of claim 12, wherein the stored instructions, which when executed by the processor, cause the processor to decrement the first reference count when an entry in a hash map no longer maps to the first shared pointer.

15. The apparatus of claim 12, wherein the stored instructions, which when executed by the processor, cause the processor to:

create a copy of the first hash map;

modify the copy of the first hash map to obtain a modified copy of the first hash map;

create a second shared pointer which points to the modified copy of the first hash map; and create a third hash map which is at the second level, wherein the third hash map maps at least one object to the second shared pointer.

16. The apparatus of claim 15, wherein the stored instructions, which when executed by the processor, cause the processor to decrement the first reference count.

17. The apparatus of claim 12, wherein the sets of objects specify a set of paths in an integrated circuit (IC) design.

* * * * *